(12) United States Patent
Ichikura et al.

(10) Patent No.: US 9,666,143 B2
(45) Date of Patent: May 30, 2017

(54) AMPLIFYING CIRCUIT

(71) Applicant: LAPIS Semiconductor Co., Ltd., Yokohama (JP)

(72) Inventors: Hiroyoshi Ichikura, Yokohama (JP); Koji Higuchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/855,376

(22) Filed: Sep. 15, 2015

(65) Prior Publication Data

US 2016/0079926 A1 Mar. 17, 2016

(30) Foreign Application Priority Data

Sep. 16, 2014 (JP) ................. 2014-187343

(51) Int. Cl.
*H03F 1/02* (2006.01)
*G09G 3/36* (2006.01)
*H03F 3/45* (2006.01)
*H03F 1/30* (2006.01)

(52) U.S. Cl.
CPC .......... *G09G 3/36* (2013.01); *H03F 3/45183* (2013.01); *H03F 3/45475* (2013.01); *H03F 1/303* (2013.01); *H03F 3/45* (2013.01); *H03F 2203/45116* (2013.01); *H03F 2203/45166* (2013.01)

(58) Field of Classification Search
CPC ...... H03F 3/45; H03F 1/3211; H03F 3/45076; H03F 3/4508; H03F 2003/45008; H03F 3/45179; H03F 2003/45004; H03F 1/303; H03F 2203/7212; H03F 2200/231; H03F 2200/414
USPC .................... 330/69, 252, 253, 295
See application file for complete search history.

(56) References Cited

U.S. PATENT DOCUMENTS

| | | | |
|---|---|---|---|
| 6,970,152 B1* | 11/2005 | Bell ..................... | G09G 3/3688 330/123 |
| 2008/0100380 A1* | 5/2008 | Nishimura ............ | H03F 3/3022 330/252 |
| 2010/0045378 A1* | 2/2010 | Steele ................. | H03F 3/45475 330/253 |
| 2015/0357974 A1* | 12/2015 | Cheng ................ | H03F 3/45179 330/253 |

FOREIGN PATENT DOCUMENTS

JP 2005-130332 A 5/2005

\* cited by examiner

*Primary Examiner* — Khanh V Nguyen
(74) *Attorney, Agent, or Firm* — Rabin & Berdo, P.C.

(57) ABSTRACT

An amplifying circuit includes a first differential amplifier (first differential pair) and a second differential amplifier (second differential pair) having an input capacitance smaller than the first differential amplifier. The amplifying circuit switches between the first differential amplifier (first differential pair) and the second differential amplifier (second differential pair) in response to an amplification mode setting signal to perform amplification processing of an input signal.

14 Claims, 12 Drawing Sheets

AMPLIFYING CIRCUIT

BACKGROUND OF THE INVENTION

1. Field of the Invention

The present invention relates to an amplifying circuit, and more particularly, relates to an amplifying circuit including a differential amplifier.

2. Description of the Related Art

A driver for driving a display panel, such as liquid crystal display panels, includes a plurality of amplifiers each configured to apply gradation voltages to data lines of the liquid crystal display panel. The gradation voltages have voltage values corresponding to the luminance levels indicated by an input video signal.

As one of such amplifiers, a differential amplifier which is configured to output one gradation voltage and includes differential pairs of two systems that receive inputs of these two systems, respectively is proposed (see, for example, Japanese Patent Application Laid-Open No. 2005-130332). Such a differential amplifier can output not only gradation voltages of these two systems but also gradation voltages of additional two systems larger (or smaller) than the former voltages obtained by combining these former input gradation voltages.

As the resolution of the liquid crystal display panels is getting higher in recent years, the amplifiers of the driver are expected to have a high speed response and a high current output. However, in order to enhance the output current of the differential amplifier, it is necessary to upsize transistor elements in differential stages that form the differential amplifier. This increases an input capacitance and decreases a response speed in proportion to the upsizing.

SUMMARY OF THE INVENTION

An object of the present invention is to provide an amplifying circuit capable of a high current output and a high speed response.

An amplifying circuit according to one aspect of the present invention is an amplifying circuit for amplifying an input signal applied thereto through its input line, and for outputting the amplified signal through its output line, the amplifying circuit including: a first differential amplifier; a second differential amplifier having an input capacitance larger than the first differential amplifier; and an amplifier switch unit for outputting, through the output line, a signal caused by amplification of the input signal in the first differential amplifier in response to an amplification mode setting signal indicative of a high speed mode, and for outputting, through the output line, a signal caused by amplification of the input signal in the second differential amplifier, in response to the amplification mode setting signal indicative of a small offset mode.

An amplifying circuit according to the present invention is an amplifying circuit for amplifying an input signal applied thereto through its input line and for outputting the amplified signal through its output line, the amplifying circuit including: a first differential pair having a first transistor and a second transistor, the first transistor being configured to pass to a first line a current corresponding to a level of a signal supplied to a gate terminal, the second transistor being configured to pass to a second line a current corresponding to a level of a signal supplied to a gate terminal; a second differential pair having a third transistor and a fourth transistor, the third transistor having an input capacitance larger than the first transistor and the second transistor and being configured to pass to the first line a current corresponding to a level of a signal supplied to a gate terminal, the fourth transistor having an input capacitance larger than the first transistor and the second transistor and being configured to pass to the second line a current corresponding to a level of a signal supplied to a gate terminal; a current source for generating a composite current of the current passing through the first line and the current passing through the second line; an output transistor for sending out to the output line a current corresponding to a voltage of the first line; and an amplifier switch unit for supplying the input signal to the gate terminal of the first transistor in the first differential pair while connecting the output line to the gate terminal of the second transistor in response to an amplification mode setting signal indicative of a high speed mode, and for supplying the input signal to the gate terminal of the third transistor in the second differential pair while connecting the output line to the gate terminal of the fourth transistor in response to the amplification mode setting signal indicative of a small offset mode.

The amplifying circuit according to the present invention includes a first differential amplifier (first differential pair) and a second differential amplifier (second differential pair) smaller in input capacitance than the first differential amplifier. The amplifying circuit switches between the first differential amplifier (first differential pair) and the second differential amplifier (second differential pair) in response to an amplification mode setting signal, so that amplification processing of an input signal can be performed. This enables the amplifying circuit to achieve a high current output and a high speed response.

DETAILED DESCRIPTION OF THE INVENTION

Hereinbelow, embodiments of the present invention will be described in detail with reference to the accompanying drawings.

Figure 1:
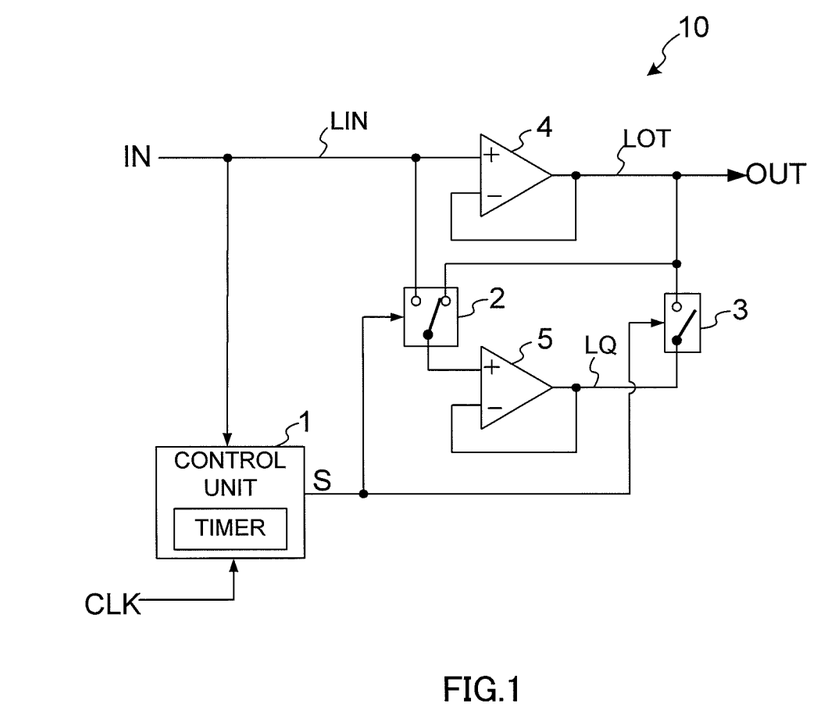
FIG. 1 is a circuit diagram illustrating the configuration of an amplifying circuit 10 according to a present invention.

FIG. 1 is a circuit diagram illustrating one example of a configuration of an amplifying circuit 10 according to the present invention. As illustrated in FIG. 1, the amplifying circuit 10 includes a control unit 1, switch elements 2 and 3, and differential amplifiers 4 and 5.

The control unit 1 generates an amplification mode setting signal S having a logic level 1 only during a specified level transition period T1, which starts upon detection of a so-called transition start point that is a point of time at which the level of an input signal IN starts to increase or decrease. The amplification mode setting signal S has a logic level 0 in other periods. That is, the control unit 1 generates the amplification mode setting signal S having the logic level 0 indicative of a high power output mode or the logic level 1 indicative of a high speed mode. The control unit 1 supplies such an amplification mode setting signal S to the switch elements 2 and 3 in timing synchronized with the clock signal CLK.

When the logic level of the amplification mode setting signal S is 0, the switch element 2 electrically connects the input line LIN to a non-inverting input terminal of the differential amplifier 5. When the logic level of the amplification mode setting signal S is 1, the switch element 2 electrically connects an output line LOT to the non-inverting input terminal of the differential amplifier 5.

When the logic level of the amplification mode setting signal S is 0, the switch element 3 is turned on so that a line LQ connected to the output terminal of the differential amplifier 5 is electrically connected to the output line LOT. When the logic level of the amplification mode setting signal S is 1, the switch element 3 is turned off, so that the line LQ is set in a high impedance state.

The differential amplifier 4 has a non-inverting input terminal connected to the input line LIN and an output terminal connected to the output line LOT. Furthermore, the output terminal and an inverting input terminal of the differential amplifier 4 are electrically connected to each other. The thus-configured differential amplifier 4 operates as a voltage follower, which amplifies an input signal IN supplied through the input line LIN with a gain of 1, and sends out a resultant voltage to the output line LOT.

As described in the foregoing, the non-inverting input terminal of the differential amplifier 5 is connected to the switch element 2. Furthermore, the output terminal and the inverting input terminal of the differential amplifier 5 are electrically connected to each other. The thus-configured differential amplifier 5 operates as a voltage follower, which amplifies the voltage supplied through the input line 2 with a gain of 1 and sends out a resultant voltage to the output line LQ.

The above-stated differential amplifier 5 is larger in input capacitance than the differential amplifier 4. Therefore, the differential amplifier 5 can output a current higher than the differential amplifier 4. Since the differential amplifier 4 is smaller in input capacitance than the differential amplifier 5, the differential amplifier 4 can respond more quickly than the differential amplifier 5, though an output current from the differential amplifier 4 is lower than that of the differential amplifier 5. Therefore, the differential amplifier 5 is a high current output-type differential amplifier, whereas the differential amplifier 4 is a high speed response-type differential amplifier.

The amplifying circuit 10 illustrated in FIG. 1 outputs an output signal OUT corresponding to voltages or a voltage sent out onto the output line LOT from both or one of the differential amplifiers 4 and 5.

Hereinbelow, the operation of the amplifying circuit 10 will be described with reference to the time chart illustrated in FIG. 2.

Figure 2:
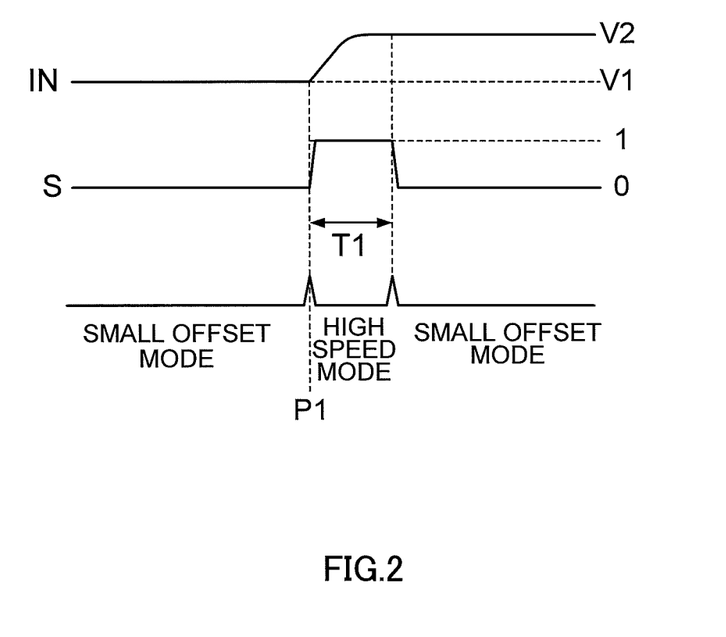
FIG. 2 is a time chart depicting one example of an amplification mode setting signal S generated by a control unit 1.

First, as illustrated in FIG. 2, while the input signal IN maintains the state of a level V1 or when changes in the level are very small, the control unit 1 supplies the amplification mode setting signal S of a logic level 0 to the switch elements 2 and 3. In response to the amplification mode setting signal S of the logic level 0, the switch element 2 supplies the input signal IN to the non-inverting input terminal of the differential amplifier 5, and the switch element 3 connects the output terminal of the differential amplifier 5 to the output line LOT. As a consequence, the amplifying circuit 10 illustrated in FIG. 1 is equivalently put in a connecting state (in a small offset mode) as illustrated in FIG. 3A.

Figure 3A:
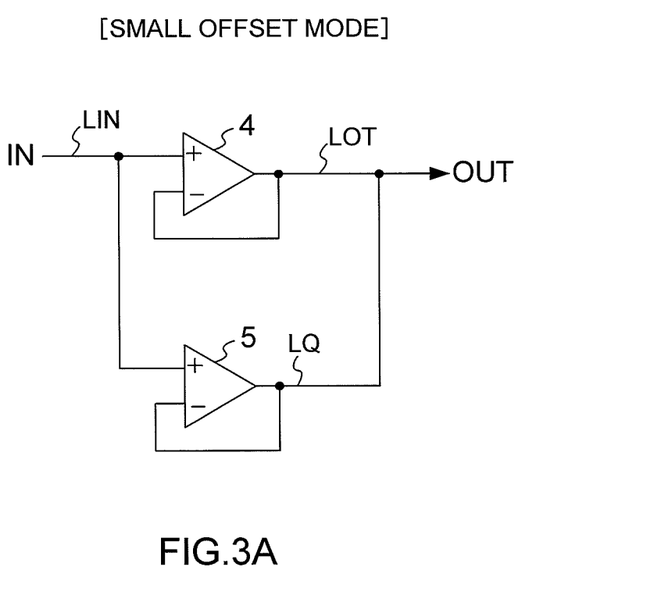
FIGS. 3A and 3B are equivalent circuit diagrams of the amplifying circuit 10 in a small offset mode.

In the small offset mode, the differential amplifiers 4 and 5 are connected in parallel as illustrated in FIG. 3A. Therefore, each of the differential amplifiers 4 and 5 sends out a voltage obtained by amplifying the input signal IN to the output line LOT. As a consequence, in the small offset mode, the currents sent from the differential amplifiers 4 and 5 are combined into a high current, and this high current is supplied to a load (not illustrated) through the output line LOT. In the small offset mode, the non-inverting input terminals in the differential amplifier 4 and 5 are electrically connected to each other, and the output terminals thereof are also connected to each other as illustrated in FIG. 3A, resulting in reduction in the offset amount. Here, if the input signal IN shifts from the state of the level V1 to the state of the level V2 at a point of time P1 as illustrated in FIG. 2, the control unit 1 supplies the amplification mode setting signal S of the logic level 1 to the switch elements 2 and 3 only during a level transition period T1. In response to the amplification mode setting signal S of the logic level 1, the switch element 2 connects the output line LOT to the non-inverting input terminal of the differential amplifier 5, so that the switch element 3 is turned off, and the output terminal of the differential amplifier 5 is set in a high impedance state. As a consequence, the amplifying circuit 10 illustrated in FIG. 1 is equivalently put in a connecting state as illustrated in FIG. 4 (a high speed mode).

Figure 4:
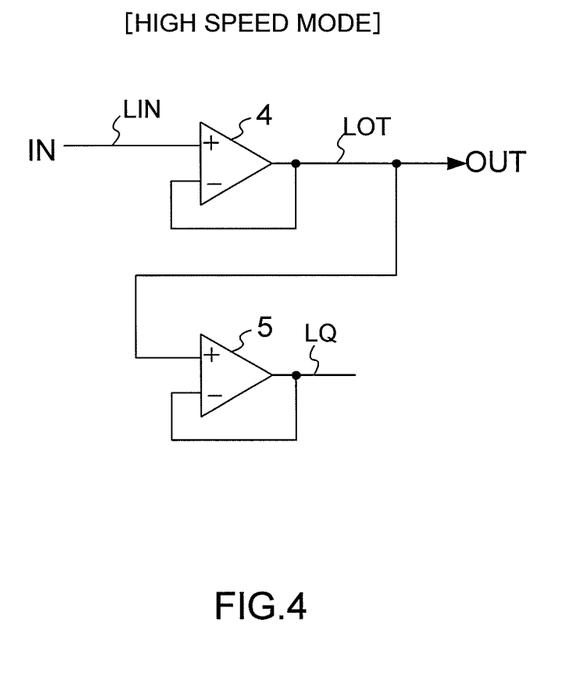
FIG. 4 is an equivalent circuit diagram of the amplifying circuit 10 in a high speed mode.

In the high speed mode, as illustrated in FIG. 4, an output signal OUT output from the differential amplifier 4 is supplied to the non-inverting input terminal of the differential amplifier 5, and the output terminal of this differential amplifier 5 is put in a high impedance state. Therefore, in the high speed mode, the input signal IN is supplied only to the differential amplifier 4 out of the differential amplifiers 4 and 5. The differential amplifier 4 amplifies the supplied input signal IN and sends out a resultant voltage to the output line LOT as an output signal OUT. In this state, since the differential amplifier 4 is smaller in input capacitance than the differential amplifier 5, the differential amplifier 4 can output the output signal OUT having a quick response to the level transition of the input signal IN.

The level transition period T1 that is an implementation period of the high speed mode refers to a period obtained by adding specified margin time to the time taken from a transition start point when the input signal IN shifts from a minimum level (or a maximum level) to a maximum level (or a minimum level) until the output of the differential amplifier 4 stabilizes.

After the lapse of the level transition period T1, the control unit 1 switches the logic level of the amplification mode setting signal S from 1 to 0 as illustrated in FIG. 2. In response to the amplification mode setting signal S of the logic level 0, the switch element 2 supplies the input signal IN to the non-inverting input terminal of the differential amplifier 5, and the switch element 3 connects the output terminal of the differential amplifier 5 to the output line LOT.

As a consequence, the amplifying circuit 10 illustrated in FIG. 1 shifts to the small offset mode which is configured to amplify the input signal IN with both the differential amplifiers 4 and 5, to combine the currents output from these differential amplifiers 4 and 5 into a high current, and to send the high current to a load through the output line LOT.

In this state, in the high speed mode immediately before the small offset mode, the amplifying operation on the input signal IN by the differential amplifier 5 is stopped. In this period of time, the voltage output from the differential amplifier 4 is supplied to the non-inverting input terminal of the differential amplifier 5 so as to charge the input capacitance thereof with the supplied voltage. As a consequence, response time of the differential amplifier 5 at the time of switchover from the high speed mode to the small offset mode is reduced.

As described in the foregoing, the amplifying circuit 10 illustrated in FIG. 1 includes the high speed response-type differential amplifier 4 and the high current output-type differential amplifier 5. When a high speed response is needed due to the level transition that occurred in the input signal IN, only the high speed response-type differential amplifier 4 is used to amplify the input signal IN (high speed mode). Accordingly, when the level transition occurs in the input signal IN, the differential amplifier 4 performs high-speed amplification processing that quickly responds to the level transition. When the level of the input signal IN becomes constant or changes in the level decreases, the amplifying circuit 10 illustrated in FIG. 1 is set to output the voltage obtained by amplifying the input signal IN in both the differential amplifiers 4 and 5 (small offset mode). This makes it possible to supply to the load a high current obtained by combining the currents output from the respective differential amplifiers 4 and 5. Furthermore, in the small offset mode, the input terminals of the differential amplifier 4 and the differential amplifier 5 are connected to each other, so that the offset amount can be reduced. Since the input capacitance of the differential amplifier 5 is charged by using the output signal in the high speed mode, the response time of the differential amplifier 5 immediately after the switchover from the high speed mode to the small offset mode is reduced.

Therefore, the amplifying circuit 10 illustrated in FIG. 1 can reduce the offset amount and achieve a high current output and a high speed response.

Figure 3B:
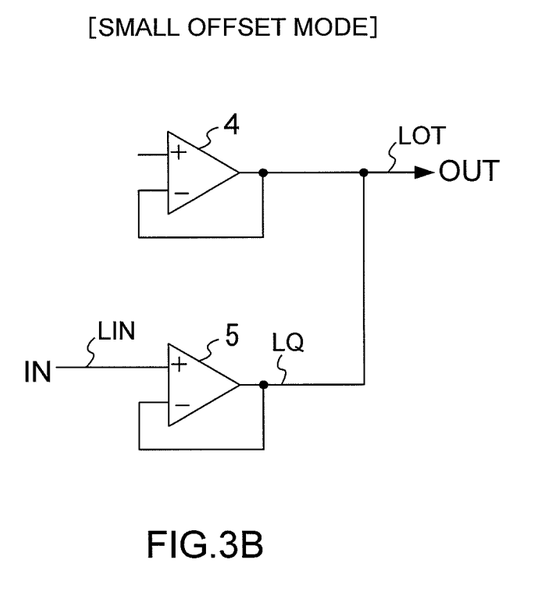

According to the embodiment illustrated in FIG. 1, the differential amplifiers 4 and 5 are connected in parallel as illustrated in FIG. 3A to amplify the input signal IN in both the differential amplifiers in the small offset mode. In this state, as illustrated in FIG. 3B for example, the connection between the input line LIN and the differential amplifier 4 may be blocked, so that the input signal IN may be amplified only with the high current output-type differential amplifier 5. More specifically, in the small offset mode, the input signal IN is amplified only with the high current output-type differential amplifier 5 out of the differential amplifiers 4 and 5, whereas in the high speed mode, the input signal IN is amplified only with the high speed response-type differential amplifier 4.

In short, the amplifying circuit 10 illustrated in FIG. 1 may include the amplifier switch units (2, 3), which are configured to switch between the first differential amplifier (4) and the second differential amplifier (5) larger in input capacitance than the first differential amplifier to perform amplification of the input signal as described below. That is, when the amplification mode setting signal (S) indicative of the small offset mode is supplied, the second differential amplifier is used for amplification, whereas when the amplification mode setting signal indicative of the high speed mode is supplied, the first differential amplifier is selected for amplification.

In the embodiment illustrated in FIG. 1, the high speed response-type differential amplifier 4 and the high current output-type differential amplifier 5 are used. However, it is possible to adopt the configuration in which one differential amplifier includes differential pairs of two systems, a high speed response-type differential pair and a high current output-type differential pair.

Figure 5:
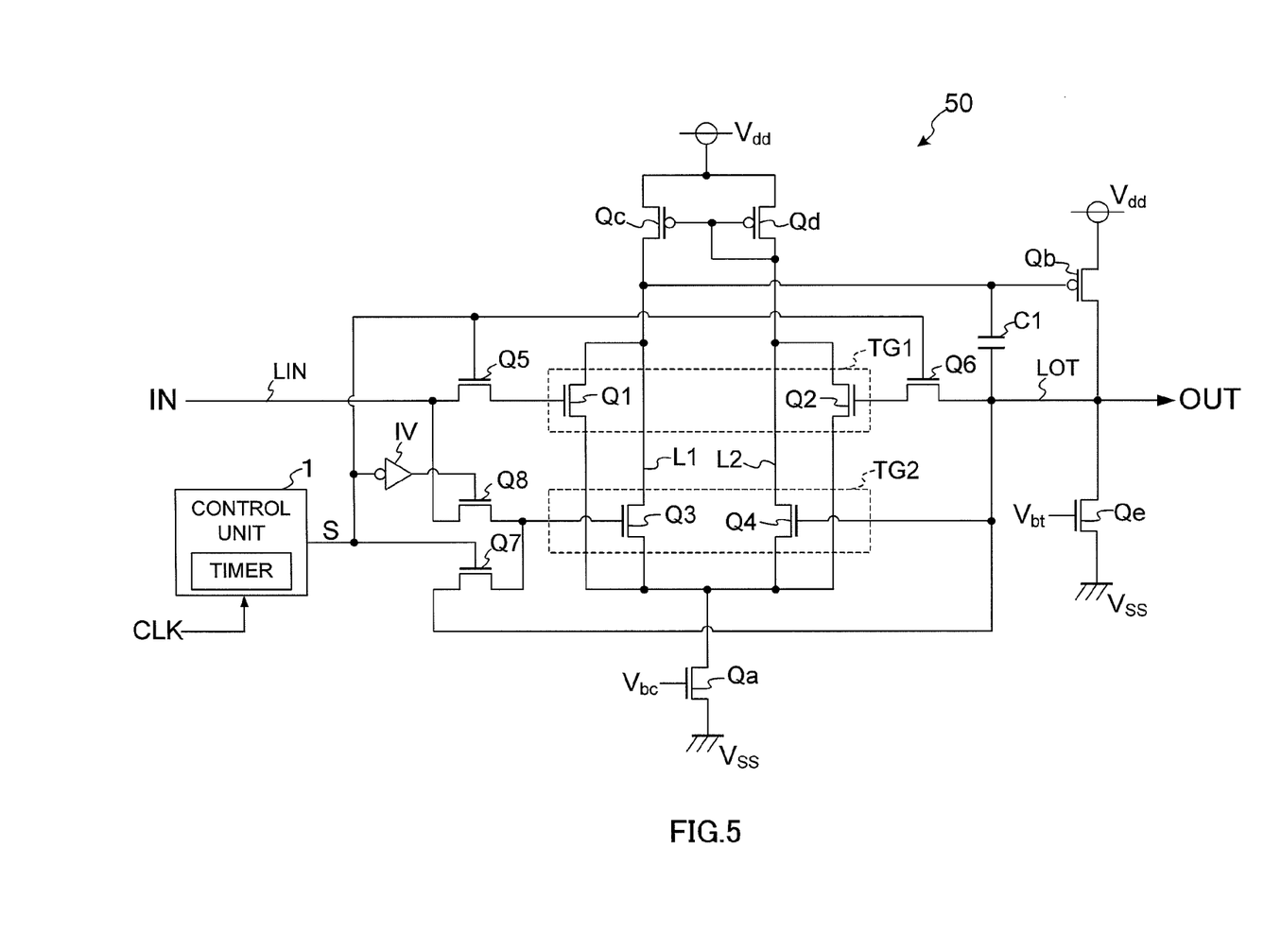
FIG. 5 is a circuit diagram illustrating a configuration of an amplifying circuit 50 as another embodiment of the amplifying circuit according to the present invention.

FIG. 5 is a circuit diagram illustrating the configuration of an amplifying circuit 50 made as another embodiment based on the above-stated configuration.

The amplifying circuit 50 includes a first differential pair TG1 and a second differential pair TG2 as differential stages of a differential amplifier. The first differential pair TG1 includes n-channel metal oxide semiconductor (MOS) transistors Q1 and Q2. The second differential pair TG2 includes n-channel MOS transistors Q3 and Q4.

The source terminals of the respective transistors QI to Q4 are connected to the drain terminal of an n-channel MOS transistor Qa serving as a current source. A bias voltage Vbc for driving the differential stages is applied to the gate terminal of the transistor Qa, and a ground voltage Vss (for example, 0 bolts) is applied to the source terminal of the transistor Qa.

The drain terminals of the respective transistors Q1 and Q3 are each connected to the drain terminal of the p-channel MOS transistor Qc, the gate terminal of a p-channel MOS transistor Qb, and one end of a capacitor C1 through the line L1. The other end of the capacitor C1 is connected to an output line LOT. A power supply voltage Vdd is applied to the source terminal of the transistor Qb serving as an output transistor, and the drain terminal of the transistor Qb is connected to the output line LOT.

The drain terminals of the respective transistors Q2 and Q4 are each connected to the gate terminal of a transistor Qc, and to the drain terminal and the gate terminal of a p-channel MOS transistor Qd through the line L2. A power supply voltage Vdd is applied to the source terminals of the respective transistors Qc and Qd.

The gate terminal of the transistor Q1, which is one transistor of the differential pair TG1, is connected to the drain terminal of an n-channel MOS transistor Q5. The source terminal of the transistor Q5 is connected to the input line LIN. The gate terminal of the transistor Q2, which is the other transistor of the differential pair TG1, is connected to the drain terminal of an n-channel MOS transistor Q6. The source terminal of the transistor Q6 is connected to the output line LOT.

The gate terminal of the transistor Q3, which is one transistor of the differential pair TG2, is connected to the drain terminals of respective n-channel MOS transistors Q7 and Q8. The source terminal of the transistor Q7 is connected to the output line LOT, and the source terminal of the transistor Q8 is connected to the input line LIN. The gate terminal of the transistor Q4, which is the other transistor of the differential pair TG2, is connected to the output line LOT. The output line LOT is further connected to the drain terminal of an n-channel MOS transistor Qe. A bias voltage Vbt for driving an output stage is applied to the gate terminal of the transistor Qe, and a ground voltage Vss (for example, 0 bolts) is applied to the source terminal of the transistor Qe.

The control unit 1 generates an amplification mode setting signal S having a logic level 1 only during a specified level transition period T1, which starts upon detection of a so-called transition start point that is a point of time at which the level of the input signal IN starts to increase or decrease. The amplification mode setting signal S has a logic level 0 in other periods. That is, the control unit 1 generates the amplification mode setting signal S having the logic level 0 indicative of a high power output mode or the logic level 1 indicative of a high speed mode. The control unit 1 supplies such an amplification mode setting signal S to the gate terminals of the respective transistors Q5 to Q7 and to an inverter IV in timing synchronized with the clock signal CLK. The inverter IV supplies an inverted amplification mode setting signal obtained by inverting the logic level of the amplification mode setting signal S to the gate terminal of the transistor Q8.

The element size of each of the transistors Q1 and Q2 in the differential pair TG1 is smaller than the element size of each of the transistors Q3 and Q4 in the differential pair TG2. Therefore, each of the transistors Q1 and Q2 is smaller in input capacitance than each of the transistors Q3 and Q4. Because of this reason, the response speed of each of the transistors Q1 and Q2 is higher than that of each of the transistors Q3 and Q4. On the contrary, each of the transistors Q3 and Q4 is larger in input capacitance than each of the transistors Q1 and Q2. Because of this reason, the transistors Q3 and Q4 can each output a current higher than each of the transistors Q1 and Q2.

In short, the differential pair TG1 is a high speed response-type differential pair that can respond more quickly than the differential pair TG2, and the differential pair TG2 is a high current output-type differential pair that can output a higher current than the differential pair TG1.

Hereinbelow, the operation of the amplifying circuit 50 illustrated in FIG. 5 will be described. First, as illustrated in FIG. 2, while the input signal IN maintains a level V1 state or when changes in the level are very small, the control unit 1 supplies the amplification mode setting signal S of a logic level 0 to the gate terminals of the respective transistors Q5 to Q7 and to the inverter IV. As a consequence, the transistors Q5 to Q7 are turned off and the transistor Q8 is turned on. In this state, the amplifying circuit 50 illustrated in FIG. 5 has a circuit configuration equivalent to the circuit configuration illustrated in FIG. 6 (small offset mode).

Figure 6:
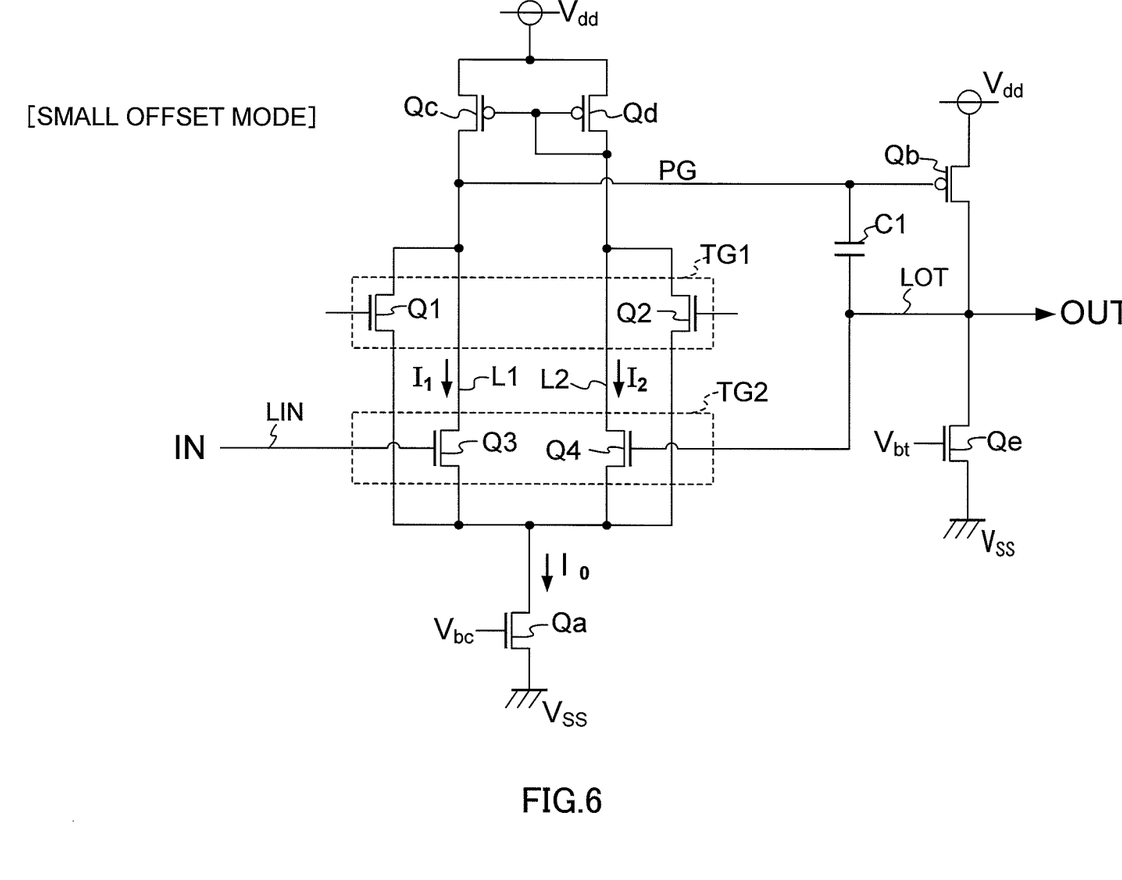
FIG. 6 is an equivalent circuit diagram of the amplifying circuit 50 in the small offset mode.

As illustrated in FIG. 6, in the small offset mode, out of the differential pairs TG1 and TG2, the differential pair TG2 is used. That is, during the small offset mode, the amplifying circuit 50 illustrated in FIG. 5 is used as a voltage follower, in which an input signal IN is supplied to the gate terminal of the transistor Q3 that is one transistor of the differential pair TG2 and an output signal OUT is supplied to the gate terminal of the transistor Q4 that is the other transistor of the differential pair TG2. The transistor Q3 passes a current $I_1$ corresponding to the input signal IN to a line L1, and the transistor Q4 passes a current $I_2$ corresponding to the output signal OUT to a line L2. In this state, the transistor Qa as a current source generates a current $I_0$ on the basis of the bias voltage Vbc. The current $I_0$ is generated by combining the current $I_1$ passing through the line L1 and the current $I_2$ passing through the line L2. Therefore, the transistors Q3 and Q4 pass the currents $I_1$ and $I_2$ to the lines L1 and L2, respectively, to satisfy the relation of $I_0=I_1+I_2$.

Accordingly, an output voltage driving signal PG having a level corresponding to the value of a difference between the input signal IN and the output signal OUT is generated on the line L1, and the generated output voltage driving signal PG is supplied to the gate terminal of the transistor Qb serving as an output transistor and to one end of the capacitor C1. The transistor Qb sends out to the output line LOT an output current based on the output voltage driving signal PG supplied to the gate terminal of the transistor Qb. At this time, the transistor Qe extracts a bias current corresponding to the bias voltage Vbt from the output line LOT. Therefore, the output signal OUT, which has a voltage value corresponding to a current value obtained by subtracting the bias current from the output current sent out from the transistor Qb, is generated on the output line LOT.

If the input signal IN shifts from the state of the level V1 to the state of the level V2 at the point of time P1 as illustrated in FIG. 2, the control unit 1 supplies the amplification mode setting signal S of the logic level 1 to the gate terminals of the respective transistors Q5 to Q7 and to the inverter IV only during the level transition period T1. As a consequence, the transistors Q5 to Q7 are turned on and the transistor Q8 is turned off. In this state, the amplifying circuit 50 illustrated in FIG. 5 has a circuit configuration equivalent to the circuit configuration illustrated in FIG. 7 (high speed mode).

Figure 7:
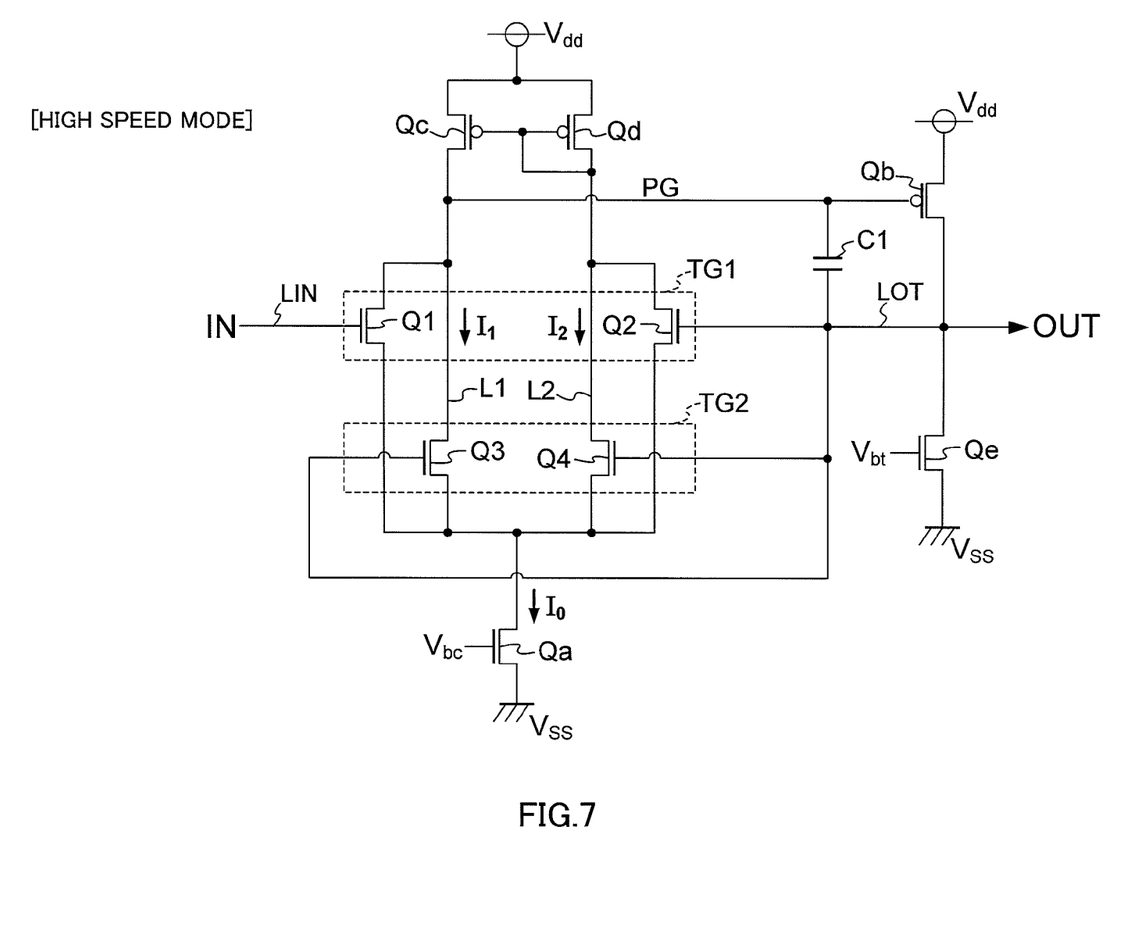
FIG. 7 is an equivalent circuit diagram of the amplifying circuit 50 in the high speed mode.

As illustrated in FIG. 7, in the high speed mode, the amplifying circuit has a voltage follower configuration, in which the input signal IN is supplied to the gate terminal of the transistor Q1 in the differential pair TG1 out of the differential pairs TG1 and TG2, and the output signal OUT is supplied to the gate terminal of the transistor Q2 in the differential pair TG1. Furthermore, in the high speed mode, the output signal OUT is supplied to the gate terminals of the respective transistors Q3 and Q4 in the differential pair TG2. The transistor Q1 passes a current $I_1$ corresponding to the input signal IN to the line L1, and the transistor Q2 passes a current $I_2$ corresponding to the output signal OUT to the line L2. In this state, the transistor Qa as a current source generates a current $I_0$ on the basis of the bias voltage Vbc. The current $I_0$ is generated by combining the current $I_1$ passing through the line L1 and the current $I_2$ passing through the line L2. Therefore, the transistors Q1 and Q2 in the differential pair TG1 pass the currents $I_1$ and 12 through the lines L1 and L2, respectively, to satisfy the relation of $I_0=I_1+I_2$.

Accordingly, an output voltage driving signal PG, which has a level corresponding to the value of a difference between the input signal IN and the output signal OUT, is generated on the line L1, and the generated output voltage driving signal PG is supplied to the gate terminal of the transistor Qb serving as an output transistor and to one end of the capacitor C1. The transistor Qb sends out to the output line LOT an output current based on the output current driving signal PG supplied to the gate terminal of the transistor Qb. At this time, the transistor Qe extracts a bias current corresponding to the bias voltage Vbt from the output line LOT. Therefore, the output signal OUT, which has a voltage value corresponding to the current value obtained by subtracting the bias current from the output current sent out from the transistor Qb, is generated on the output line LOT.

As described in the foregoing, the amplifying circuit 50 illustrated in FIG. 5 includes a high speed response-type differential pair TG1 and a high current output-type differential pair TG2 as differential stages of a differential amplifier. When a high speed response is needed due to the level transition that occurred in the input signal IN, the amplifying circuit 50 uses the high speed response-type differential pairs TG1, out of the differential pairs TG1 and TG2, to perform amplification processing (high speed mode). When the level of the input signal IN becomes constant or changes in the level decreases, the amplifying circuit 50 uses the high current output-type differential pair TG2, out of the differential pairs TG1 and TG2, to perform amplification processing (small offset mode). Since the input capacitance of each of the transistors Q3 and Q4 in the differential pair TG2 is charged by using the output signal in the high speed mode, the response time of the differential pair TG immediately after the switchover from the high speed mode to the small offset mode is reduced. Furthermore, in the small offset mode, the amplifying circuit 50 uses the differential pair TG2 including the transistors (Q3, Q4), which are larger in the input capacitance than the transistors (Q1, Q2) included in the differential pair TG1, so that the offset amount is small.

Therefore, the amplifying circuit 50 illustrated in FIG. 5 can reduce the offset amount and can achieve a high current output and a high speed response.

In short, the amplifying circuit 50 includes differential stages including the first and second differential pairs (TG1, TG2), a current source (Qa) configured to generate a composite current by combining the currents passing through first and second lines (L1, L2) connected to these differential pairs, and an output transistor (Qb) configured to send out a current corresponding to the voltage of the first line to the output line (LOT). The first differential pair (TG1) has a first transistor (Q1) configured to pass to the first line (L1) a current corresponding to the level of a signal supplied to the gate terminal, and a second transistor (Q2) configured to pass to the second line (L2) a current corresponding to the level of a signal supplied to the gate terminal. The second differential pair (TG2) has a third transistor (Q3) and a fourth transistor (Q4). The third transistor (Q3) is larger in input capacitance than the first and the second transistors and is configured to pass to the first line a current corresponding to the level of a signal supplied to the gate terminal. The fourth transistor (Q4) is larger in input capacitance than the first and the second transistors and is configured to pass to the second line a current corresponding to the level of a signal supplied to the gate terminal. Amplifier switch units (Q5 to Q8 and 1V) perform the following connecting switchover in order to selectively use one of the first and the second differential pairs, in response to an amplification mode setting signal (S). That is, when the amplification mode setting signal (logic level 1) indicative of the high speed mode is supplied, the amplifier switch units supply an input signal to the gate terminal of the first transistor in the first differential pair out of the first and the second differential pairs, and connect the output line to the gate terminal of the second transistor. When the amplification mode setting signal (logic level 0) indicative of the small offset mode is supplied, the amplifier switch units supply the input signal to the gate terminal of the third transistor in the second differential pair out of the first and second differential pairs, and connect the output line to the gate terminal of the fourth transistor.

In the above-described embodiment, the control unit 1 switches between the high speed mode and the small offset mode with a level transition start point in the input signal IN as a starting point. However, the switchover may periodically be performed irrespective of the input signal IN.

Figure 8:
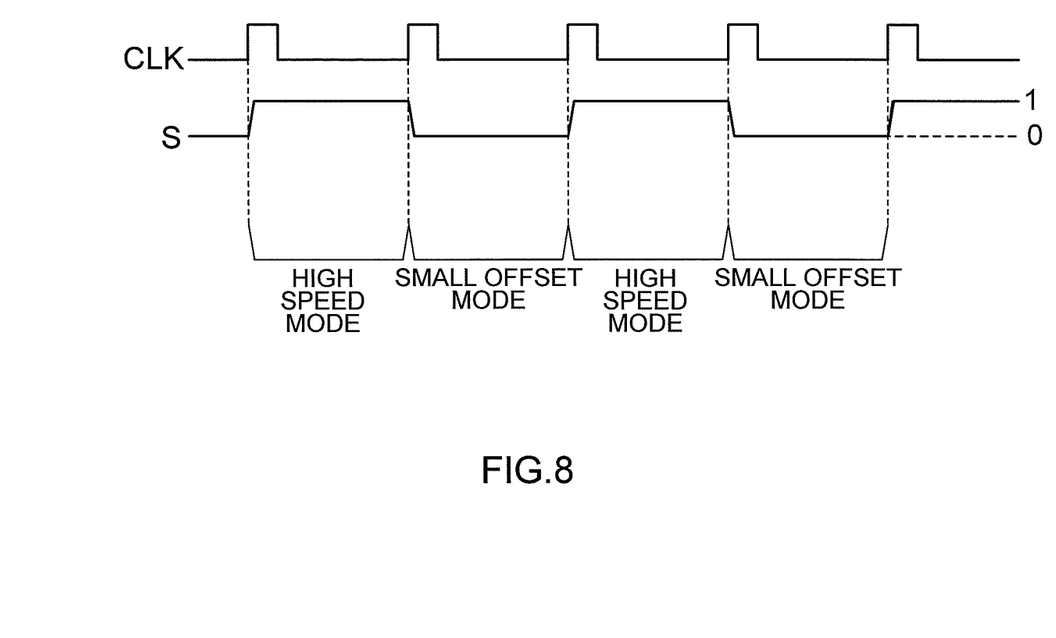
FIG. 8 is a time chart depicting another example of the amplification mode setting signal S generated by the control unit 1.

For example, as illustrated in FIG. 8, the control unit 1 may generate an amplification mode setting signal S having a logic level inverted at every rising edge of the clock signal CLK. Accordingly, the switchover from the small offset mode to the high speed mode, or the switchover from the high speed mode to the small offset mode are periodically executed at every rising edge of the clock signal CLK.

Figure 9:
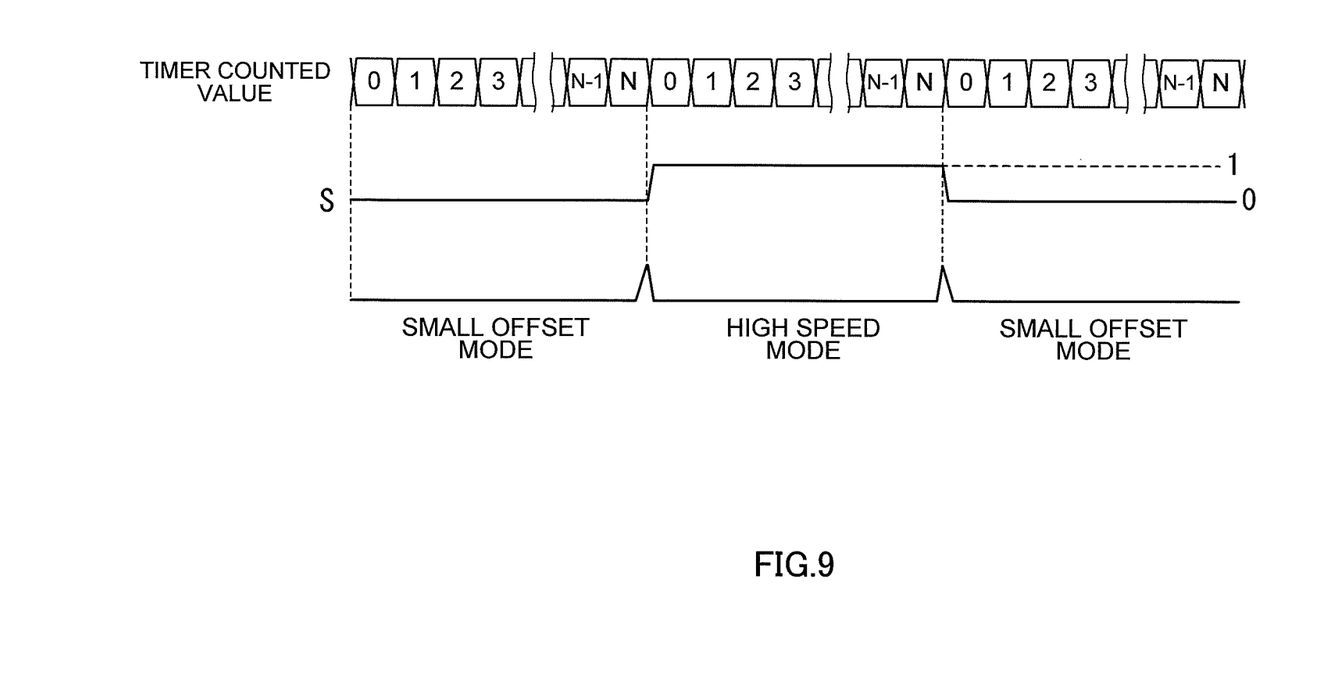
FIG. 9 is a time chart depicting another example of the amplification mode setting signal S generated by the control unit 1.

For example, as illustrated in FIG. 9, the control unit 1 may initialize the counted time to zero and generate an amplification mode setting signal S having a logic level inverted whenever the time counted by a timer reaches "N" (N is an integer greater than or equal to 2). Accordingly, the switchover from the small offset mode to the high speed mode, or the switchover from the high speed mode to the small offset mode is periodically executed every "N" time.

When the load connected to the amplifying circuit illustrated in FIG. 1 or FIG. 5 is a capacitive load such as a liquid crystal display panel, the amplifying circuit may be provided with a switch configured to temporarily block the electric connection with the capacitive load.

Figure 10:
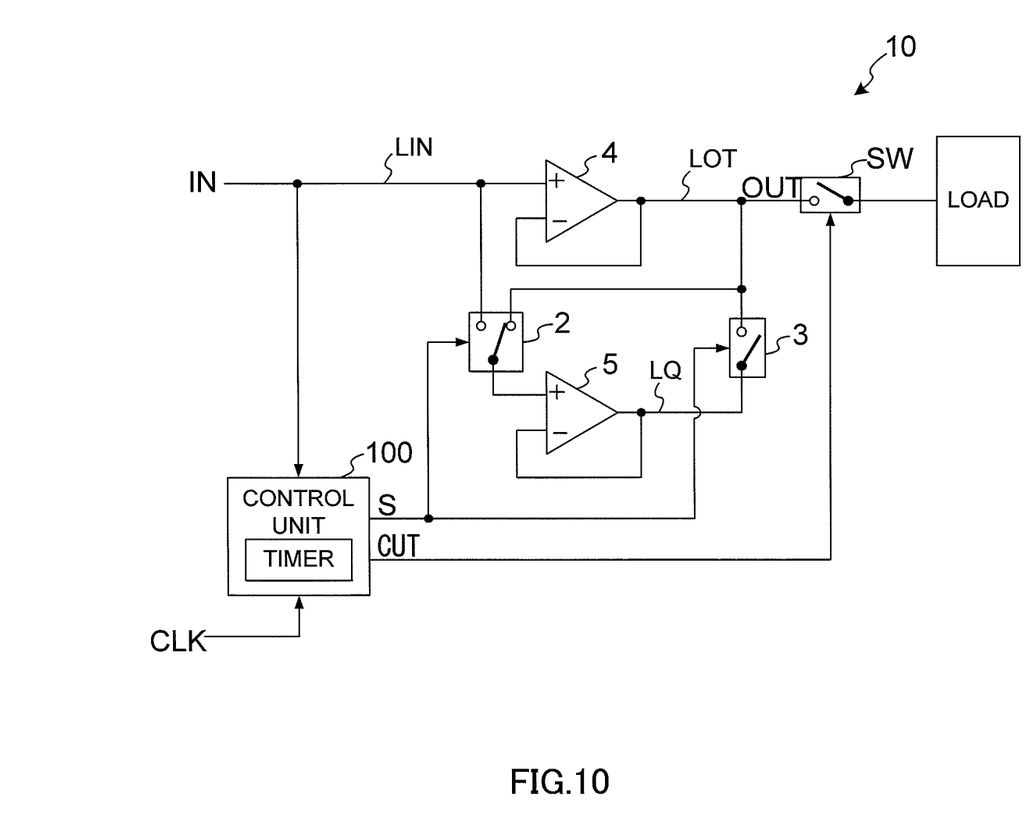
FIG. 10 is a circuit diagram illustrating a modified example of the amplifying circuit 10.
Figure 11:
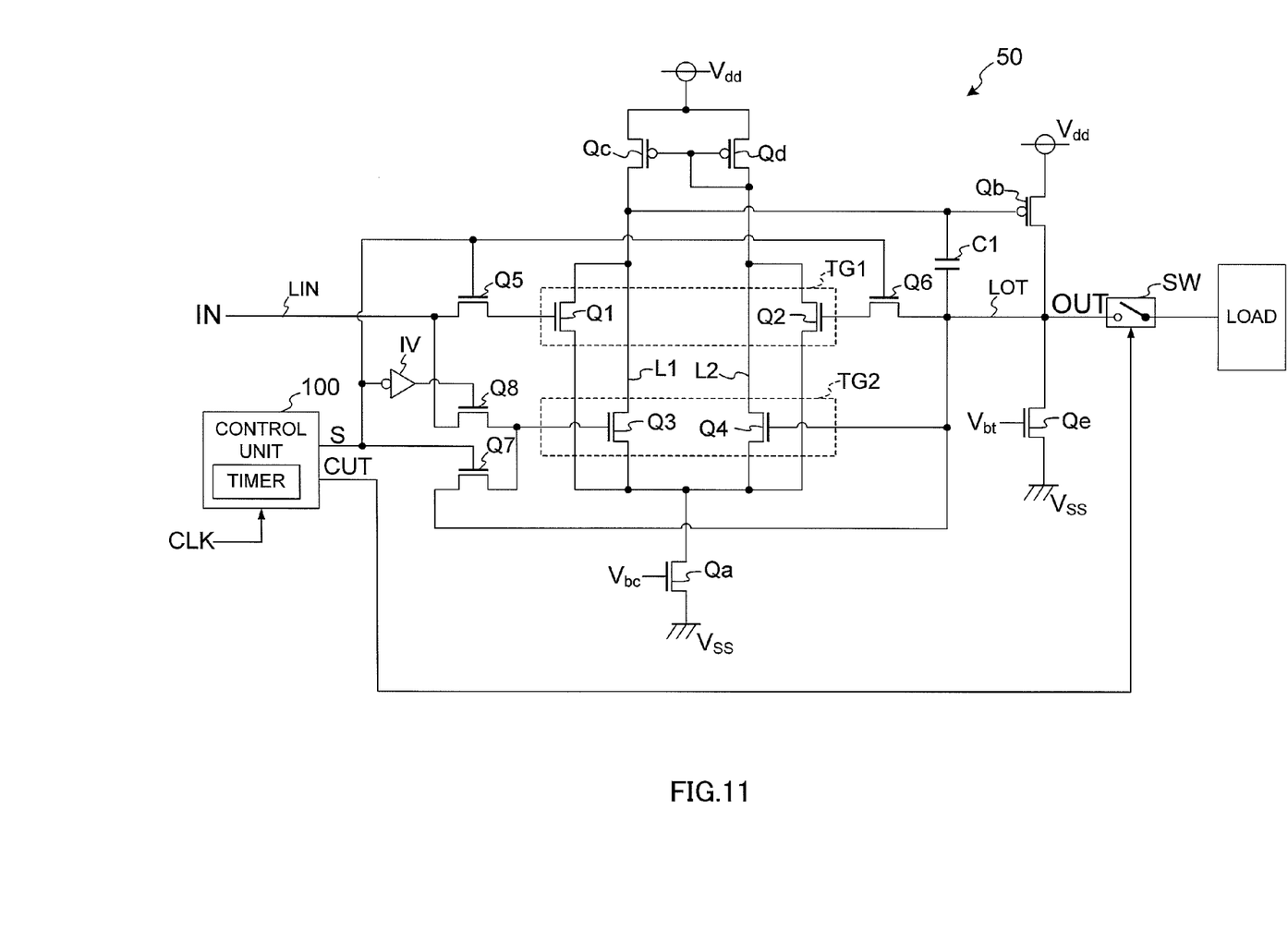
FIG. 11 is a circuit diagram illustrating a modified example of the amplifying circuit 50.

For example, in the configuration of the amplifying circuit 10 illustrated in FIG. 1, one end of an output switch SW is connected to the output line LOT, and the other end of the output switch SW is connected to the load as illustrated in FIG. 10. In the configuration of the amplifying circuit 50 illustrated in FIG. 5, one end of the output switch SW is connected to the output line LOT, and the other end of the output switch SW is connected to the load as illustrated in FIG. 11. In the amplifying circuit illustrated in FIGS. 10 and 11, a control unit 100 is used in place of the above-stated control unit 1.

Figure 12:
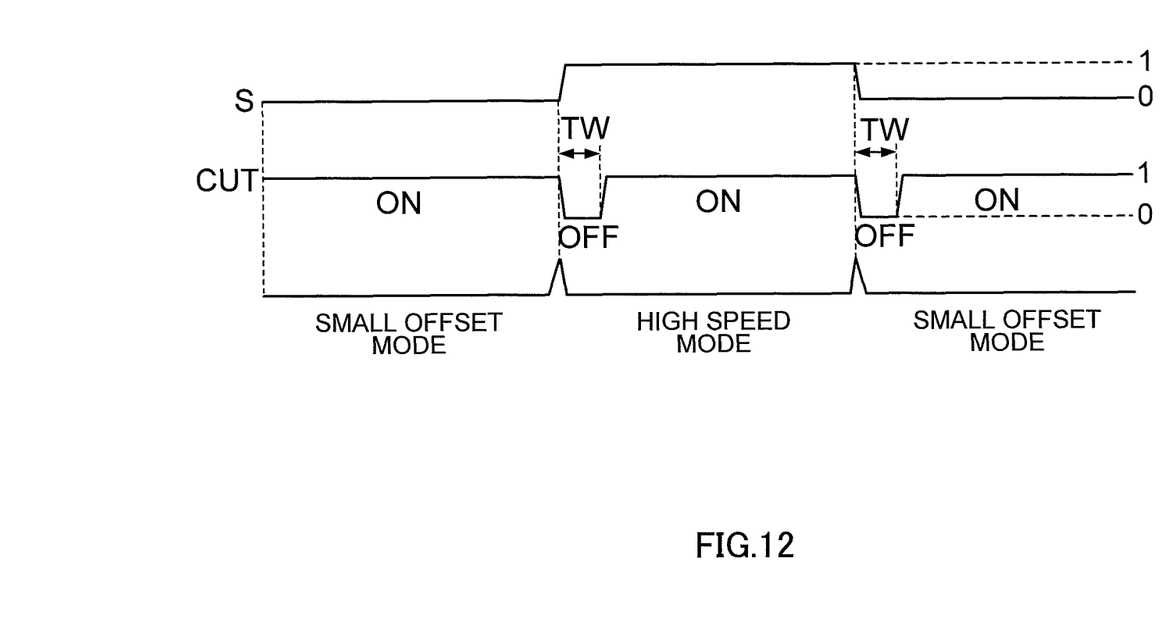
FIG. 12 is a time chart depicting one example of the amplification mode setting signal S and an output cutoff signal CUT generated by a control unit 100.

As illustrated in FIG. 12, the control unit 100 generates an amplification mode setting signal S in the same manner as the control unit 1. Furthermore, as illustrated in FIG. 12, the control unit 100 generates an output cutoff signal CUT configured to turn off the output switch SW only during a specified switchover waiting period TW at the time when the mode is switched in response to the amplification mode setting signal S, and to turn on the output switch SW in other periods. The generated signal is supplied to the output switch SW. The switchover waiting period TW refers to a period obtained by adding specified margin time to the time taken until the output signal OUT stabilizes after the start of the switchover by the amplification mode setting signal S.

Therefore, according to the configuration illustrated in FIG. 10 or FIG. 11, the level of the output signal OUT drops momentarily at the time of mode switchover, but the influence of the drop in the output signal OUT is not reflected upon the load side since the electric connecting between the capacitive load and the amplifying circuit is blocked during this period (TW). When the electric connecting with the amplifying circuit is blocked, the load side can still maintain the voltage provided immediately before the blocking, since the load is a capacitive load.

Therefore, if the amplifying circuit illustrated in FIG. 10 or FIG. 11 is used as an output amplifier for the driver that supplies gradation voltages to a capacitive display panel such as liquid crystal display panels, it becomes possible to display satisfactory images free from image distortion at the time of the mode switchover.

This application is based on Japanese Patent Application No. 2014-187343 which is herein incorporated by reference.

What is claimed is:
1. An amplifying circuit for amplifying an input signal applied thereto through its input line, and for outputting the amplified signal through its output line, the amplifying circuit comprising:
a first differential amplifier;
a second differential amplifier having an input capacitance larger than the first differential amplifier; and an amplifier switch unit for outputting, through the output line, a signal caused by amplification of the input signal in the first differential amplifier in response to an amplification mode setting signal indicative of a high speed mode, and for outputting, through the output line, a signal caused by amplification of the input signal in the second differential amplifier, in response to the amplification mode setting signal indicative of a small offset mode.

2. The amplifying circuit according to claim 1, further comprising a control unit for generating the amplification mode setting signal indicative of the high speed mode only during a period from transition start time at which a level of the input signal starts to increase or decrease until the level of the input signal becomes constant, and for generating the amplification mode setting signal indicative of the small offset mode in other periods.

3. The amplifying circuit according to claim 1, wherein
the input line is connected to an input terminal of the first differential amplifier and the output line is connected to an output terminal of the first differential amplifier, and
the amplifier switch unit connects the input line to an input terminal of the second differential amplifier while connecting an output terminal of the second differential amplifier to the output line when the amplification mode setting signal indicates the small offset mode, whereas the amplifier switch unit connects the output line to the input terminal of the second differential amplifier, while blocking the connection between the output line and the output terminal of the second differential amplifier when the amplification mode setting signal indicates the high speed mode.

4. The amplifying circuit according to claim 3, wherein the amplifier switch unit includes:
a first switch for connecting the input line to the input terminal of the second differential amplifier when the amplification mode setting signal indicates the small offset mode, and for connecting the output line to the input terminal of the second differential amplifier when the amplification mode setting signal indicates the high speed mode, and
a second switch for connecting the output line to the output terminal of the second differential amplifier when the amplification mode setting signal indicates the small offset mode, and for blocking the connection between the output line and the output terminal of the second differential amplifier when the amplification mode setting signal indicates the high speed mode.

5. The amplifying circuit according to claim 1, further comprising an output switch for connecting the output line to a load, and wherein
the output switch blocks the connection between the output line and the load only during a specified switchover waiting period from a transition point of time at which the amplification mode setting signal shifts from a state indicative of the small offset mode to a state indicative of the high speed mode, or from the state indicative of the high speed mode to the state indicative of the small offset mode.

6. The amplifying circuit according to claim 1, further comprising a control unit for generating the amplification mode setting signal configured to be switched, at every edge of a clock signal, from a state indicative of the high speed mode to a state indicative of the small offset mode, or from the state indicative of the small offset mode to the state indicative of the high speed mode in an alternate manner.

7. The amplifying circuit according to claim 1, further comprising a control unit for generating the amplification mode setting signal configured to be switched, at every predetermined period counted by a timer, from a state indicative of the high speed mode to a state indicative of the small offset mode, or from the state indicative of the small offset mode to the state indicative of the high speed mode in an alternate manner.

8. An amplifying circuit for amplifying an input signal applied thereto through its input line and for outputting the amplified signal through its output line, the amplifying circuit comprising:
a first differential pair having a first transistor and a second transistor, the first transistor being configured to pass to a first line a current corresponding to a level of a signal supplied to a gate terminal, the second transistor being configured to pass to a second line a current corresponding to a level of a signal supplied to a gate terminal;
a second differential pair having a third transistor and a fourth transistor, the third transistor having an input capacitance larger than the first transistor and the second transistor and being configured to pass to the first line a current corresponding to a level of a signal supplied to a gate terminal, the fourth transistor having an input capacitance larger than the first transistor and the second transistor and being configured to pass to the second line a current corresponding to a level of a signal supplied to a gate terminal;
a current source for generating a composite current of the current passing through the first line and the current passing through the second line;
an output transistor for sending out to the output line a current corresponding to a voltage of the first line; and
an amplifier switch unit for supplying the input signal to the gate terminal of the first transistor in the first differential pair while connecting the output line to the gate terminal of the second transistor in response to an amplification mode setting signal indicative of a high speed mode, and for supplying the input signal to the gate terminal of the third transistor in the second differential pair while connecting the output line to the gate terminal of the fourth transistor in response to the amplification mode setting signal indicative of a small offset mode.

9. The amplifying circuit according to claim 8, further comprising a control unit for generating the amplification mode setting signal indicative of the high speed mode only during a period from transition start time at which a level of the input signal starts to increase or decrease until the level of the input signal becomes constant, and for generating the amplification mode setting signal indicative of the small offset mode in other periods.

10. The amplifying circuit according to claim 8, wherein the amplifier switch unit couples the output line to each of the gate terminals of the third transistor and the fourth transistor in the second differential pair when the amplification mode setting signal indicates the high speed mode.

11. The amplifying circuit according to claim 8, wherein the amplifier switch unit includes:
a fifth transistor configured to be turned on so as to connect the input line to the gate terminal of the first transistor when the amplification mode setting signal indicates the high speed mode;
a sixth transistor configured to be turned on so as to connect the output line to the gate terminal of the second transistor when the amplification mode setting signal indicates the high speed mode;
a seventh transistor configured to be turned on so as to connect the output line to the gate terminal of the third transistor when the amplification mode setting signal indicates the high speed mode; and
an eighth transistor configured to be turned on so as to connect the input line to the gate terminal of the third transistor when the amplification mode setting signal indicates the small offset mode.

12. The amplifying circuit according to claim 8, further comprising an output switch for connecting the output line to a load, and wherein
the output switch blocks the connection between the output line and the load only during a specified switchover waiting period from a transition point of time at which the amplification mode setting signal shifts from a state indicative of the small offset mode to a state indicative of the high speed mode, or from the state indicative of the high speed mode to the state indicative of the small offset mode.

13. The amplifying circuit according to claim 8, further comprising a control unit for generating the amplification mode setting signal configured to be switched, at every edge of a clock signal, from a state indicative of the high speed mode to a state indicative of the small offset mode, or from the state indicative of the small offset mode to the state indicative of the high speed mode in an alternate manner.

14. The amplifying circuit according to claim 8, further comprising a control unit for generating the amplification mode setting signal configured to be switched, at every predetermined period counted by a timer, from a state indicative of the high speed mode to a state indicative of the small offset mode, or from the state indicative of the small offset mode to the state indicative of the high speed mode in an alternate manner.

* * * * *